(12) United States Patent
Shen et al.

(10) Patent No.: US 8,604,793 B2
(45) Date of Patent: Dec. 10, 2013

(54) SUPERCONDUCTING MAGNET HAVING COLD IRON SHIMMING CAPABILITY

(75) Inventors: Weijun Shen, Florence, NC (US); Yuri Lvovsky, Florence, NC (US); Zhenyu Zhang, Florence, NC (US)

(73) Assignee: General Electric Company, Schenectady, NY (US)

( * ) Notice: Subject to any disclaimer, the term of this patent is extended or adjusted under 35 U.S.C. 154(b) by 521 days.

(21) Appl. No.: 12/909,533

(22) Filed: Oct. 21, 2010

(65) Prior Publication Data

US 2012/0098538 A1    Apr. 26, 2012

(51) Int. Cl.
*G01R 33/3873* (2006.01)
*G01R 33/3815* (2006.01)

(52) U.S. Cl.
USPC .......................... 324/320; 324/319

(58) Field of Classification Search
USPC .................. 324/300–322; 382/128–131; 600/407–435; 335/296–306
See application file for complete search history.

(56) References Cited

U.S. PATENT DOCUMENTS

| | | | |
|---|---|---|---|
| 4,771,244 A | | 9/1988 | Vermilyea |
| 4,990,877 A | * | 2/1991 | Benesch ..................... 335/301 |
| 5,280,247 A | * | 1/1994 | DeMeester et al. ......... 324/318 |
| 5,289,128 A | * | 2/1994 | DeMeester et al. ......... 324/318 |
| 5,463,364 A | | 10/1995 | Muller |
| 5,736,859 A | | 4/1998 | Gore |
| 5,760,585 A | | 6/1998 | Dorri |
| 6,313,634 B1 | * | 11/2001 | Kasten ........................ 324/320 |
| 6,529,005 B1 | * | 3/2003 | Kasten et al. ............... 324/320 |
| 6,788,060 B1 | * | 9/2004 | Feenan et al. ............... 324/320 |
| 6,853,855 B2 | | 2/2005 | Ideler |
| 6,906,606 B2 | | 6/2005 | Jacobs |
| 6,995,562 B2 | | 2/2006 | Laskaris et al. |
| 7,196,520 B2 | | 3/2007 | Shen et al. |
| 7,372,275 B2 | * | 5/2008 | Feenan ....................... 324/322 |
| 7,459,908 B2 | | 12/2008 | Juchem |
| 7,495,442 B2 | | 2/2009 | Heid |
| 7,495,544 B2 | | 2/2009 | Stilp |
| 7,508,209 B2 | * | 3/2009 | Dietz et al. .................. 324/318 |
| 7,570,141 B2 | * | 8/2009 | Hollis et al. ................. 335/216 |
| 7,800,368 B2 | * | 9/2010 | Vaughan et al. ............ 324/318 |
| 7,884,605 B2 | * | 2/2011 | Tamura et al. .............. 324/318 |

(Continued)

FOREIGN PATENT DOCUMENTS

EP    0715180 A1    6/1996
EP    0715181 A1    6/1996

(Continued)

OTHER PUBLICATIONS

Search Report from corresponding GB Application No. GB1117202.0 dated Jan. 31, 2012.

*Primary Examiner* — Melissa Koval
*Assistant Examiner* — Tiffany Fetzner
(74) *Attorney, Agent, or Firm* — The Small Patent Law Group; Dean D. Small

(57) ABSTRACT

A method of shimming a superconducting magnet assembly that includes a cryostat and a superconducting magnet configured to be installed in the cryostat. The method includes determining a plurality of field inhomogeneity characteristics of the superconducting magnet while the superconducting magnet is at room temperature and prior to the superconducting magnet being sealed in the cryostat, and installing an initial set of passive shims inside the cryostat while the superconducting magnet is at room temperature, the initial set of passive shims reducing the determined field inhomogeneity characteristics when the superconducting magnet is operating at a normal operational temperature.

23 Claims, 14 Drawing Sheets

(56) References Cited

U.S. PATENT DOCUMENTS

| | | | |
|---|---|---|---|
| 2006/0262826 A1* | 11/2006 | Dietz et al. | 372/96 |
| 2007/0126541 A1* | 6/2007 | Hollis et al. | 335/299 |
| 2008/0129298 A1* | 6/2008 | Vaughan et al. | 324/322 |
| 2012/0098538 A1* | 4/2012 | Shen et al. | 324/318 |
| 2012/0249137 A1* | 10/2012 | Witschey et al. | 324/309 |

FOREIGN PATENT DOCUMENTS

| | | |
|---|---|---|
| EP | 1653243 A1 | 5/2006 |
| EP | 1811314 A1 | 7/2007 |
| JP | 10097917 A | 4/1998 |
| JP | 2000037366 A | 2/2000 |
| JP | 2001224571 A | 8/2001 |

\* cited by examiner

SUPERCONDUCTING MAGNET HAVING COLD IRON SHIMMING CAPABILITY

BACKGROUND OF THE INVENTION

The subject matter disclosed herein relates generally to the superconducting magnets, and more particularly to a method of passively shimming a superconducting magnet in an imaging system.

Magnetic Resonance Imaging (MRI) systems typically include a superconducting magnet that generates a primary magnetic field within an imaging volume. Inhomogeneities in the primary magnetic field may be caused by manufacturing tolerances for the magnet, as well as equipment and site conditions. In operation, magnetic field inhomogeneities may distort the position information in the imaging volume and degrade the image quality. The imaging volume must have a low magnetic field inhomogeneity to produce high quality images.

Shimming is a known technique for reducing the inhomogeneity of the primary magnetic field. The primary magnetic field is essentially a large constant field with small inhomogeneous field components superimposed on the constant field. If the negative of the inhomogeneous components of the field can be generated, the net field can be made uniform and the magnet is then referred to as shimmed.

It is known to use active or passive shims for reducing the magnetic field inhomogeneity. Active shimming may be accomplished using resistive and/or superconducting shim coils to generate magnetic fields designed to cancel out the inhomogeneous field components. Known passive shimming is accomplished after the magnet has been installed in the imaging system. Specifically, after installation, a magnetic field is induced into the magnet to identify inhomogeneous field components. Passive shims that cancel out the inhomogeneous field components are then identified. The passive shims are then installed in a conventional shim tray that is located near, or inside, a gradient coil structure that generates the x, y, and z gradient magnetic fields used for MR imaging.

However, during operation, the conventional passive shims are in thermal contact with the gradient coil structure, e.g. in the warm bore area of the MRI imaging system. Specifically, pulsing the gradient coils results in heat generation due to joule losses. A portion of the heat generated is transferred to the passive shims causing an increase in the temperature of the passive shims. The increased temperature of the passive shims reduces the magnetization of the shim material and weakens the magnetic field that the passive shims produce, thereby causing an increase in the magnetic field inhomogeneity. As a result, the passive shims installed in the shim trays installed in the warm bore area are subjected to varying temperatures that affect the magnetic permeability of the passive shims and therefore may not, adequately compensate for magnetic field inhomogeneities during operation. Moreover, there may not be adequate room in the shim trays to install the passive shims required to compensate for magnetic field inhomogeneities during operation.

BRIEF DESCRIPTION OF THE INVENTION

In one embodiment, a method of shimming a superconducting magnet assembly that includes a cryostat and a superconducting magnet configured to be installed in the cryostat is provided. The method includes determining a plurality of field inhomogeneity characteristics of the superconducting magnet while the superconducting magnet is at room temperature and prior to the superconducting magnet being sealed in the cryostat, and installing an, initial set of passive shims inside the cryostat while the superconducting magnet is at room temperature, the initial set of passive shims reducing the determined field inhomogeneity characteristics when the superconducting magnet is operating at a normal operational temperature.

In another embodiment, a superconducting magnet assembly is provided. The superconducting magnet assembly includes a superconducting magnet including a coil former and a plurality of magnetic coils formed on the coil former, and an initial set of passive shims installed on the superconducting magnet.

In a further embodiment, a Magnetic Resonance Imaging (MRI) system is provided. The MRI system includes superconducting magnet assembly including a superconducting magnet including a coil former and a plurality of magnetic coils formed on the coil former, and an initial set of passive shims installed on the superconducting magnet.

DETAILED DESCRIPTION OF THE INVENTION

Figure 1:
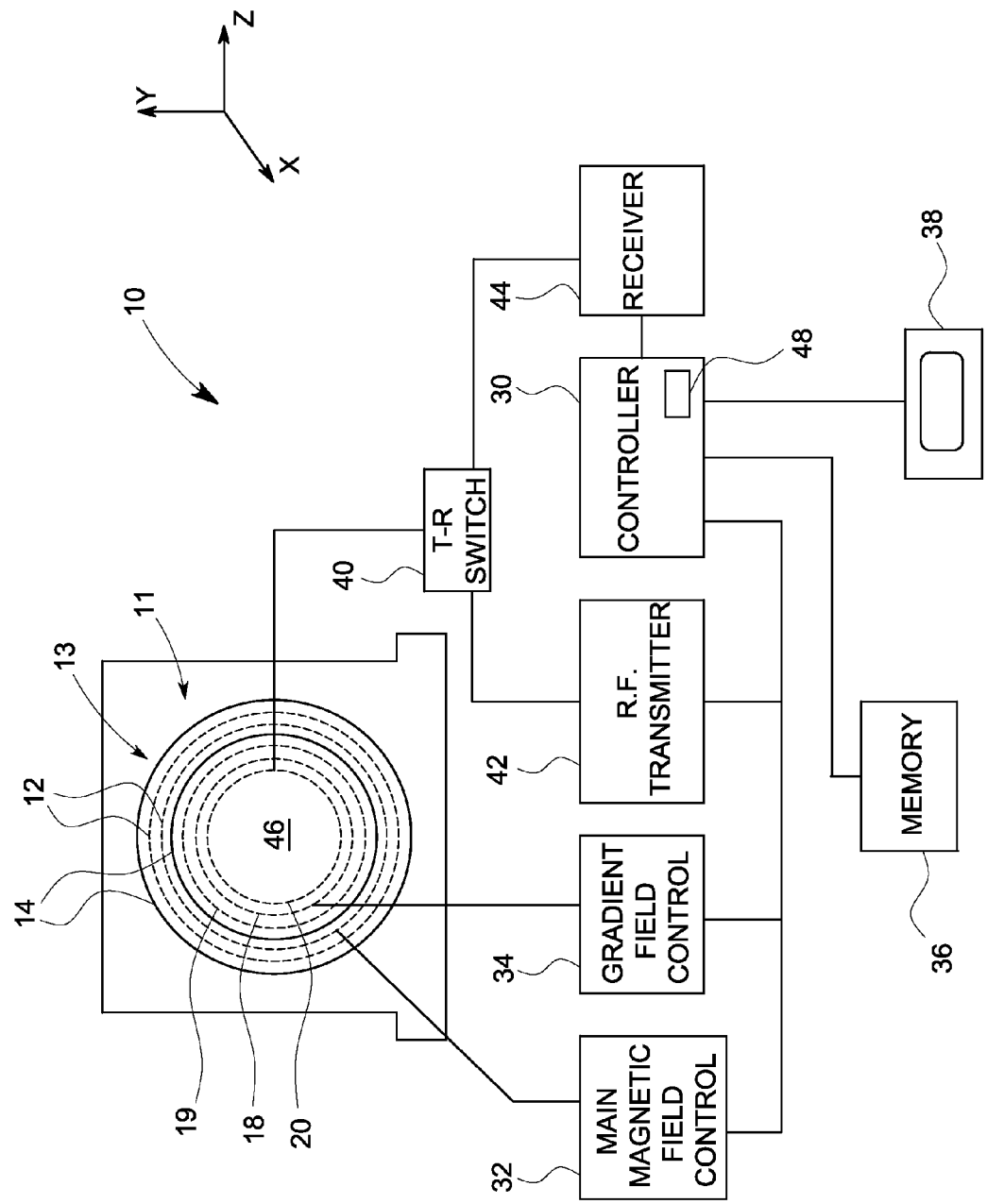
FIG. 1 is a schematic block illustration of an exemplary imaging system formed in accordance with various embodiments.

Embodiments of the invention will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that, property.

Various embodiments described herein provide a superconducting magnet and method for passively shimming a superconducting magnet. By practicing at least one embodiment, and at least one technical effect of various embodiments, personnel are enabled to determine field inhomogeneity characteristics of the superconducting magnet prior to the superconducting magnet being installed in an imaging system, while the superconducting magnet is at room temperature. Passive shims may then be installed on the superconducting magnet based on the these characteristics.

Various embodiments of the superconducting magnet and methods described herein may be provided as part of, or used with, a medical imaging system, such as imaging system 10 shown in FIG. 1. It should be appreciated that although the imaging system 10 is illustrated as a single modality imaging system, the various embodiments may be implemented in or with multi-modality imaging systems. For example, the imaging system 10 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 10 includes a superconducting magnet assembly 11 that includes a superconducting magnet 12. The superconducting magnet 12 is formed from a plurality of magnetic coils supported on a magnet coil support structure that is discussed in more detail below. In one embodiment, the superconducting magnet assembly 11 may also include a thermal shield 13. A helium vessel 14 surrounds the superconducting magnet 12, and the thermal shield 13 surrounds the helium vessel 14. An outer vacuum vessel 15 surrounds the thermal shield 13. The helium vessel 14, the thermal shield 13, and the outer vacuum vessel 15 described above together form a cryostat 17. In operation, the vessel 14 is filled with liquid helium to cool the coils of the superconducting magnet 12. A thermal insulation (not shown) may be provided in a space between the helium vessel 14 and the outer vacuum vessel 15. The imaging system 10 also includes a main gradient coil 18, a shield gradient coil 19, and an RF transmit coil 20. The imaging system 10 also generally includes a controller 30, a main magnetic field control 32, a gradient field control 34, a memory 36, a display device 38, a transmit-receive (T-R) switch 40, an RF transmitter 42 and a receiver 44.

In operation, a body of an object, such as a patient (not shown), or a phantom to be imaged, is placed in a bore 46 on a suitable support, for example, a motorized table (not shown) or other patient table. The superconducting magnet 12 produces a uniform and static main magnetic field $B_o$ across the bore 46. The strength of the electromagnetic field in the bore 46 and correspondingly in the patient, is controlled by the controller 30 via the main magnetic field control 32, which also controls a supply of energizing current to the superconducting magnet 12.

The main gradient coil 18, which may include one or more gradient coil elements, is provided so, that a magnetic gradient can be imposed on the magnetic field $B_o$ in the bore 46 in any one or more of three orthogonal directions x, y, and z. The main gradient coil 18 is energized by the gradient field control 34 and is also controlled by the controller 30.

The RF transmit coil 20, which may include a plurality of coils (e.g., resonant surface coils), is arranged to transmit magnetic pulses and/or optionally simultaneously detect MR signals from the patient, if receive coil elements are also provided. The RF transmit coil 20 and the receive surface coil, if provided, may be selectably interconnected to one of the RF transmitter 42 or receiver 44, respectively, by the T-R switch 40. The RF transmitter 42 and T-R switch 40 are controlled by the controller 30 such that RF field pulses or signals are generated by the RF transmitter 42 and selectively applied to the patient for excitation of magnetic resonance in the patient.

Following application of the RF pulses, the T-R switch 40 is again actuated to, decouple the RF transmit coil 20 from the RF transmitter 42. The detected MR signals are in turn communicated to the controller 30. The controller 30 includes a processor 48 that controls the processing of the MR signals to produce signals representative of an image of the patient. The processed signals representative of the image are also transmitted to the display device 38 to provide a visual display of the image. Specifically, the MR signals fill or form a k-space that is Fourier transformed to obtain a viewable image. The processed signals representative of the image are then transmitted to the display device 38.

Figure 2:
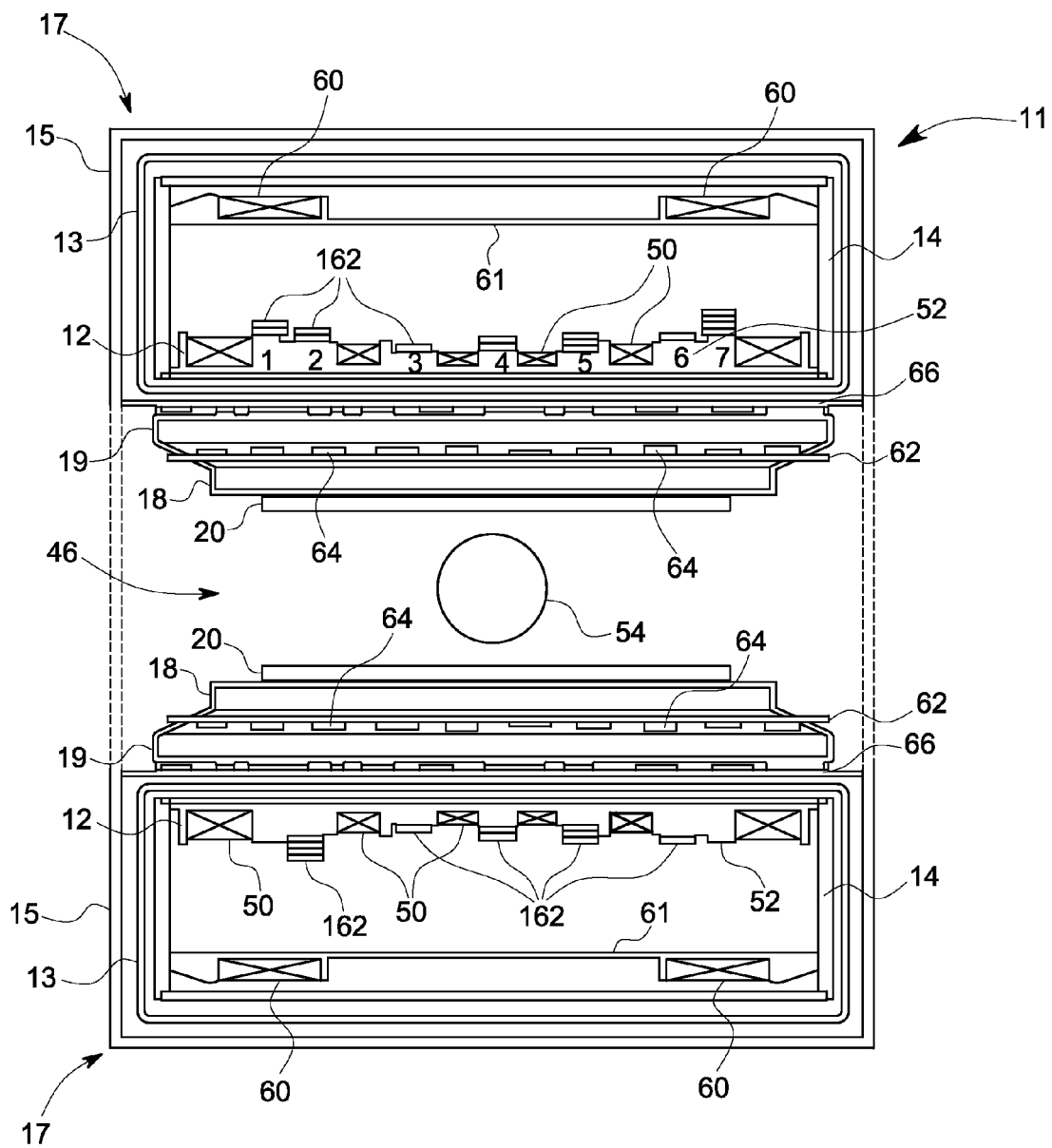
FIG. 2 is a cross-sectional view of a portion of the imaging system shown in FIG. 1 in accordance with various embodiments.

FIG. 2 is a cross-sectional view of a portion of the superconducting magnet assembly 11 shown in FIG. 1. As discussed above, the superconducting magnet 12 is installed in the vessel 14, which is typically filled with liquid helium to facilitate cooling the superconducting magnet 12 during operation. In some embodiments, the liquid helium maintains the superconducting magnet 12 at approximately 4 degrees Kelvin during operation.

The superconducting magnet 12 includes a plurality of magnetic coils 50 that are supported on a magnet coil support structure or coil former 52. The superconducting magnet 12 also includes a plurality of magnetic coils 60, also referred to as shielding coils, that are supported on a magnet coil support structure or shielding coil former 61. In the exemplary embodiment, the superconducting magnet 12 includes six magnetic coils 50 and two magnetic coils 60 for a total of eight magnetic coils. However, it should be realized that the superconducting magnet 12 may include any quantity of magnetic coils 50 and magnetic coils 60 for generating a homogeneous magnetic field in an imaging volume 54 defined within the bore 46.

During operation, when the main gradient coil 18 is electrically pulsed, the resulting time changing magnetic flux in any of the electrically conducting cylinders surrounding the main gradient coil 18 induces eddy currents. These eddy currents in turn may produce their own magnetic fields, which degrade the quality of the desired gradient field in space and time. Accordingly, in the exemplary embodiment, the imaging system 10 may also include a shield gradient coil 13 to compensate for the pulse sequences. The shield gradient coil 13 sets up fields that counteract the fields generated by the main gradient coil 18 in the region outside of the shield coil 13, thus reducing any mutual inductance with conducting members, such as the thermal shields, and reducing the resultant eddy currents.

Moreover, the imaging system 10 may also include a set of passive shims 64, referred to herein as tray shims 64, that are installed in removable shim drawers 62 or trays that hold the tray shims 64. The tray shims 64 are arranged by thickness and/or locations in the drawers 62 to reduce the inhomogeneity of the primary magnetic field generated by the superconducting magnet 12. As discussed above, it is desirable to reduce or eliminate any magnetic field inhomogeneity to improve image quality. However, during operation, the tray shims 64 installed outside of the vessel 14, in the shim tray 62, are in thermal contact with the outer section of the gradient coil structure, e.g. in the warm bore area of the imaging system 10. Therefore, a temperature increase in the tray shims 64 may reduce the magnetization of the shim material and weaken the magnetic field the tray shims 64 produce causing an increase in the magnetic field inhomogeneity. In the exemplary embodiment, the imaging system 10 may also include a plurality of shims 66 that are installed between the shield coil 19 and the superconducting magnet 12.

Figure 3:
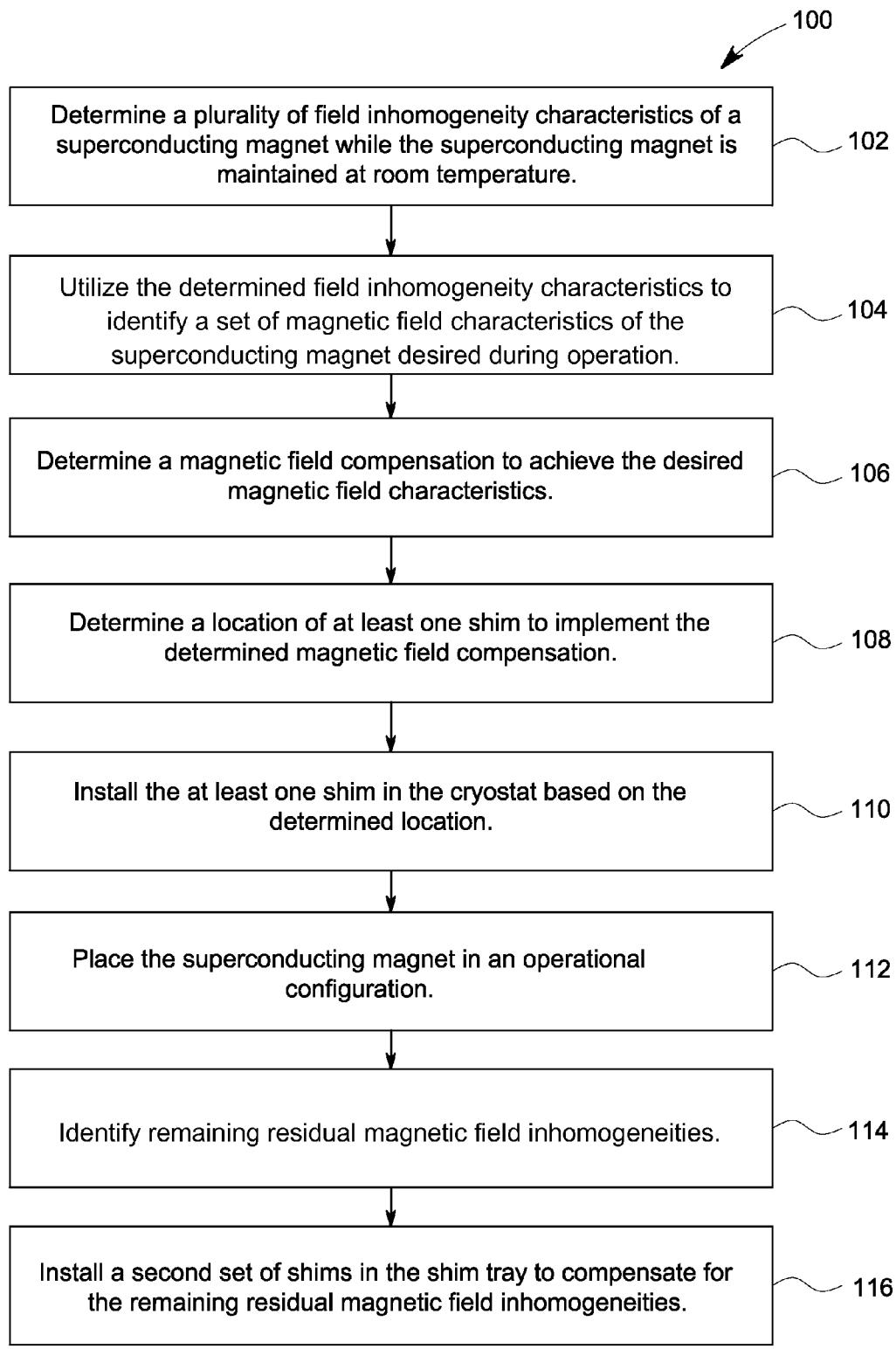
FIG. 3 is a flowchart of an exemplary method for passively shimming a superconducting magnet assembly in accordance with various embodiments.

FIG. 3 is flowchart illustrating an exemplary method 100 for passively shimming a superconducting magnet assembly, such as the superconducting magnet assembly 11 shown in FIG. 2 to facilitate reducing and/or eliminating magnetic field inhomogeneity and to increase the quality of images. The method utilizes both the tray shims 64 and an additional set of passive shims, referred to herein a magnet shims and discussed in more detail below, to facilitate reducing and/or eliminating magnetic field inhomogeneity.

At 102, the field homogeneity characteristics of the superconducting magnet, such as the superconducting magnet 12, for example, are determined while the superconducting magnet 12 is at room temperature. The field homogeneity characteristics of the superconducting magnet 12 may determined using a computer shim code, or any other suitable process or method, that is installed, for example, on the processor 48. In the exemplary embodiment, the field homogeneity characteristics of the superconducting magnet 12 are determined prior to superconducting magnet 12 being sealed within the cryostat 17, which is a procedure also referred to herein as cold iron installation. Specifically, the field homogeneity characteristics are preferably determined while fabricating the superconducting magnet 12 and prior to the superconducting magnet 12 being sealed within the cryostat 17. Therefore, room temperature may be represented as a temperature that is greater than the normal operational temperature of approximately 4 degrees Kelvin as discussed above. For example, room temperature may be between approximately 60 degrees Fahrenheit and approximately 100 degrees Fahrenheit.

In the exemplary embodiment, the field inhomogeneity characteristics of the superconducting magnet 12 may be determined utilizing several different methods. The field inhomogeneity characteristics may include, for example, the field distribution of the coils 50, the map of the field, and/or harmonics of the magnetic field. The field inhomogeneity characteristics may be measured directly from the superconducting magnet 12 itself as is discussed in more detail below. The field inhomogeneity characteristics may also be measured indirectly based on geometric characteristics. For example, during assembly, the size of the coil former 52 may vary for each superconducting magnet being manufactured. Additionally, the width or circumference of the magnetic coils 50 may vary. Thus, in one embodiment, measuring the geometric characteristics includes, for example, acquiring specific measurements of the coil former 52 including the width and circumference of the slots configured to receive magnetic coils 50 therein. Additionally, measuring the geometric characteristics includes may also include, for example, measuring the width, diameter, and/or circumference of each coil 50, after each coil 50 is wound on the coil former 52. It should be realized that while it is desirable to fabricate each superconducting magnet to have substantially the same geometric characteristics, that in practice, the geometric characteristics for each superconducting magnet may vary. Once, the exact location of each coil 50 is determined, these locations may be utilized to determine the field characteristics of the superconducting magnet while operating in a normal operational configuration, as discussed in more detail below.

To measure the field inhomogeneity characteristics directly from the superconducting magnet 12, the plurality of magnetic coils 50 are initially coupled together in series. A relatively small current is then input to the series of magnetic coils 50 to generate a magnetic field. The magnetic field is then measured, or mapped, by measuring the magnetic field strength at a plurality of predetermined points, that typically all lie on the surface of the imaging volume 54. Mapping further includes using the measured magnetic field to identify the magnetic field inhomogeneity. The spatial field mapping may be performed using, for example, Hall probes, a Fluxgate, a rotation coil, or any other suitable magnetic field measurement device.

At 104, the field inhomogeneity characteristics are utilized to identify a set of magnetic field characteristics of the superconducting magnet 12 that are desired to be achieved during normal operation. More specifically, at 102 the actual field inhomogeneity characteristics of the as-built superconducting magnet 12 are determined. The as-build field inhomogeneity characteristics are then used to extrapolate what the field inhomogeneity characteristics of the superconducting magnet 12 would be when the superconducting magnet 12 is operating at the normal operating temperature when sealed within the cryostat 17.

At 106, the field inhomogeneity characteristics determined at step 104 are utilized to determine the compensation to be installed to achieve the desired magnetic field characteristics of the superconducting magnet 12 at the normal operating temperature. More specifically, at 106, a shim code, for example, may be utilized to determine the magnetic field compensation that is required to enable the superconducting magnet 12 to have the desired magnetic field characteristics determined at 104.

At 108, the compensation determined at 106 is utilized to determine a shim material, a shim size, and/or a shim location that corrects for inhomogeneities in the magnetic field that are expected to occur when the superconducting magnet 12 is operated in its normal operating state. In the exemplary embodiment, the compensation, the shim size, location, etc. may be determined using the shim code discussed above.

Figure 4:
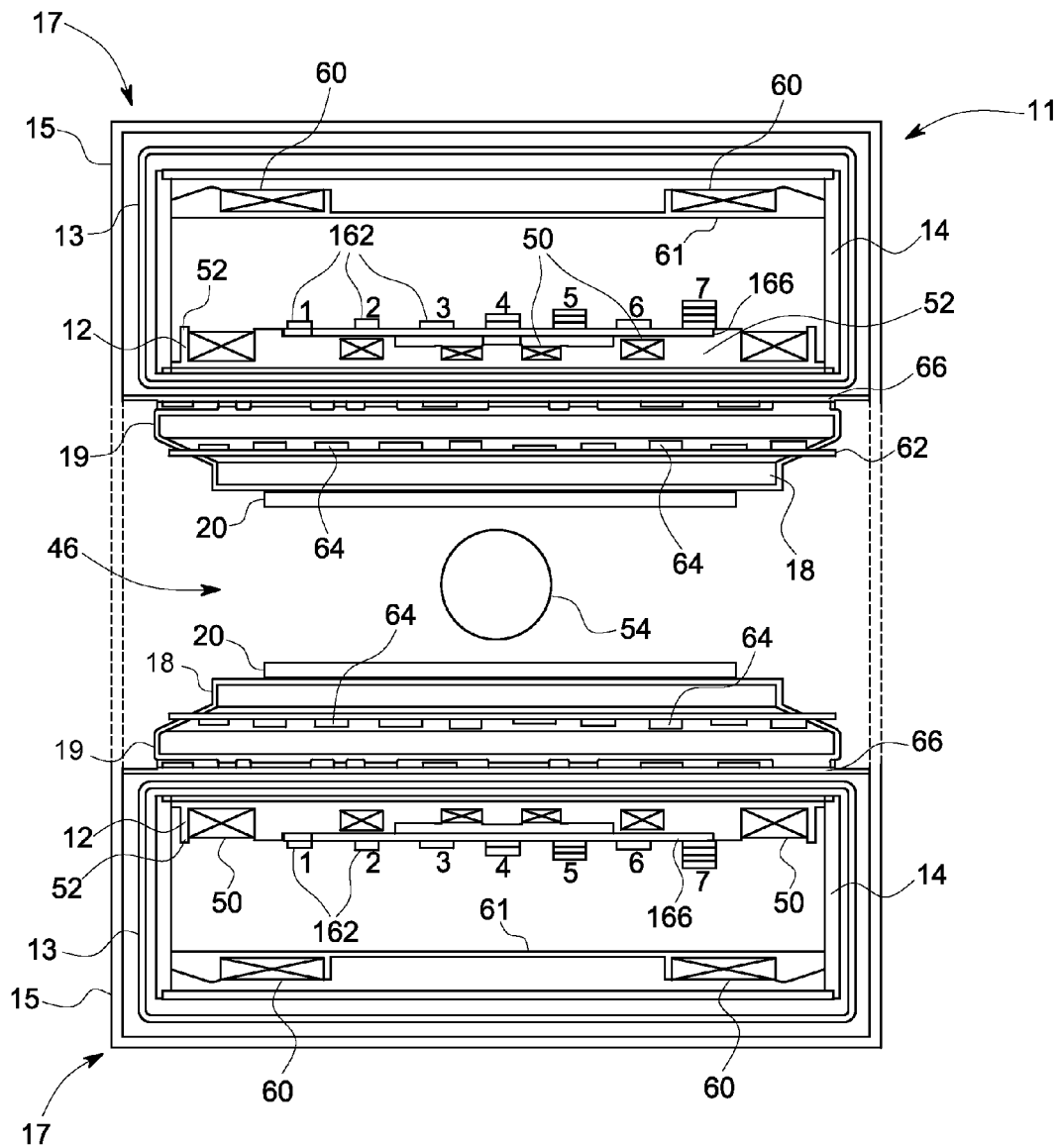
FIG. 4 is another cross-sectional view of a portion of the imaging system shown in FIG. 1 in accordance with various embodiments.

At 110, a first or initial set of passive shims 162, e.g. the magnet shims 162, calculated at 106 are installed on the superconducting magnet 12. It should be realized that the magnet shims 162 are different than the tray shims 64 installed in the shim tray 62. Specifically, the tray shims 64 are installed in the shim tray 62, which is located externally from the vessel 14 in the warm bore area of the superconducting magnet assembly 11. Whereas, the magnet shims 162, in one embodiment, are mechanically mounted directly to the superconducting magnet 12 inside the vessel 14. Thus, the magnet shims 162 are not generally affected by the warm bore temperature changes during operation. In one exemplary embodiment, referring again to FIG. 2, the magnet shims 162 are mounted to the coil former 52. Optionally, as shown in FIG. 4, the magnet shims 162 may be mounted to a separate shim structure or shim holder 166 that is then mounted to the coil former 52. Thus, the shim holder 166 also functions as a load bearing structural component of the superconducting magnet 12. Specifically, during operation, relatively large magnetic forces may cause the outermost coils 50 to be displaced from each other. Therefore, the shim holder 166 also functions as a structural splint to compensate for these magnetic forces and therefore, limit the movement of the outermost coils. In the exemplary embodiment, the magnet shims 162 are fabricated from a ferromagnetic material and/or a ferrimagnetic material.

Figure 5:
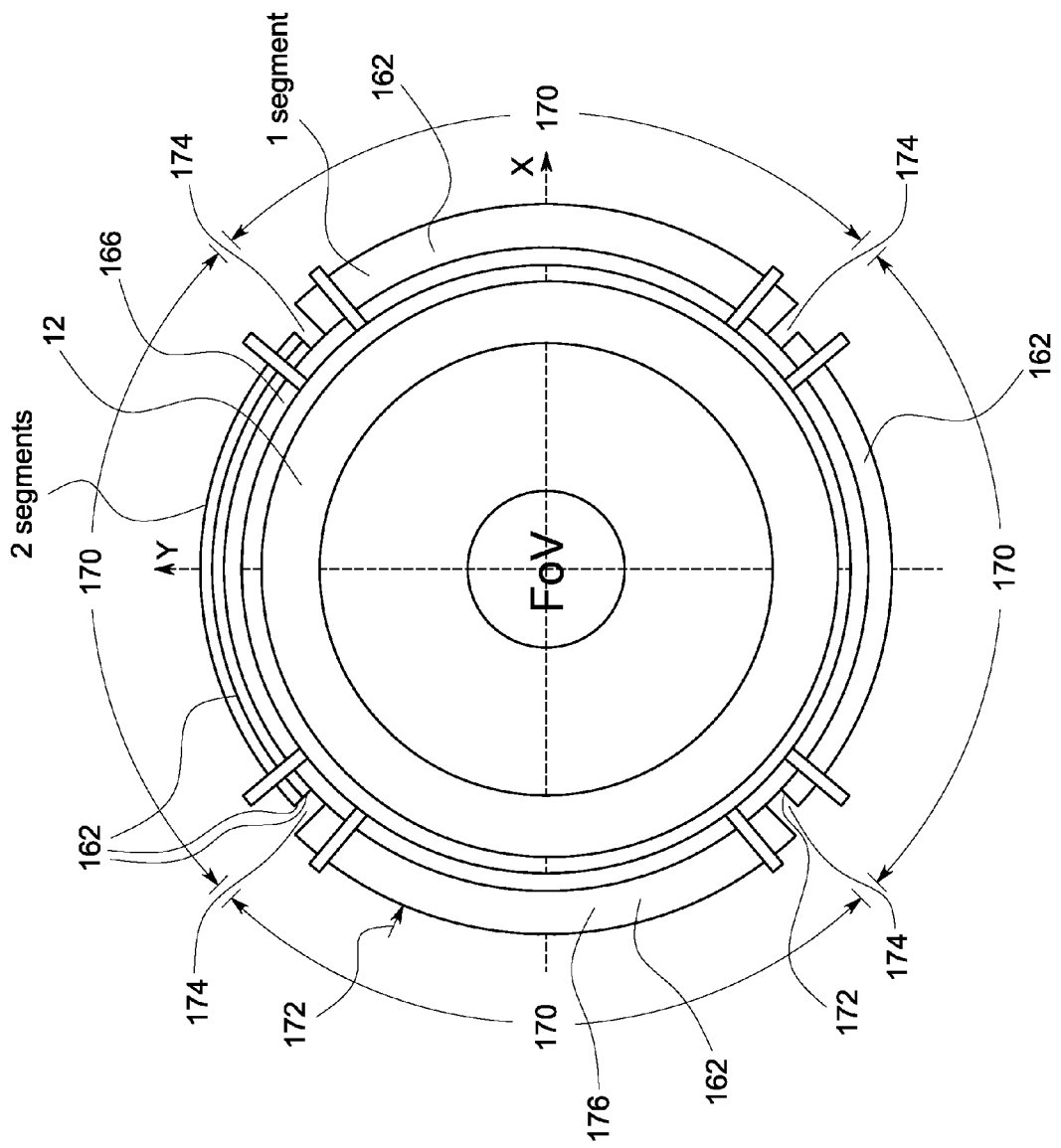
FIG. 5 is an end view of the superconducting magnet assembly shown in FIG. 4 in accordance with various embodiments.

In one embodiment, each magnet shim 162 is fabricated from the same material and has the same size, e.g. length and width, and the same thickness. Optionally, the magnet shims 162 may be fabricated from different magnetic material and have different sizes, e.g. length and width, and different thicknesses. For example, FIG. 5 is an end view of a portion of the superconducting magnet assembly 11 shown in FIG. 4 illustrating various exemplary dimensions of the magnet shims 162. In this embodiment, the magnet shims 162 are mounted to the shim holder 166. As shown in FIG. 5, the magnet shims 162 may have a length 170 that extends approximately 90 degrees circumferentially around the superconducting magnet 12. Optionally, the magnet shims 162 may have a length 170 that extends approximately 180 degrees circumferentially around the superconducting magnet 12. In other embodiments, the magnet shims 162 may have any length 170. For example, the magnet shims 162 may have a length that extends five degrees, 10 degrees, 30 degrees, circumferentially around the superconducting magnet 12 or any other length that facilitates reducing or removing the field harmonics identified during the mapping procedure.

Moreover, the magnet shims 162 may have a predetermined thickness 172 to enable one or more magnet shims 162 to be stacked together at the same location on the superconducting magnet 12, as shown in FIGS. 2 and 4 to produce a desired thickness. Optionally, the magnet shims 162 may be fabricated to have a thickness such that only a single magnet shim 162 is utilized to facilitate removing the field harmonics identified during the mapping procedure. Therefore, referring again to FIG. 5, the magnet shims 162 may have a total combined thickness 172 that varies based on the location of the magnet shims 162 when mounted to the superconducting magnet 12. For example, as shown in FIGS. 2 and 4, there may be a single magnet shim 162 installed at other radial positions, denoted as positions 3 and 6. There may be two magnet shims 162 installed at some radial positions, denoted as positions 1, 2, and 4. There may be three magnet shims 162 installed at some other radial positions, denoted as position 5. There may also be four magnet shims 162 installed at some radial positions, denoted as position 7. It should be realized that the locations and quantities of magnet shims 162 are determined during the mapping procedure discussed above. Moreover, it should be realized that although multiple magnet shims 162 may be shown as installed at a single radial location, a single magnet shim 162 having a desired thickness that facilitates reducing or removing the field harmonics identified during the mapping procedure may also be utilized.

In operation, utilizing a plurality of shims 162 that are formed into a ring 176 provides for eddy current interruption. More specifically, as shown in FIG. 5, a gap 174 between adjacent shims 162 facilitates interrupting eddy currents. Moreover, stacking the shims 162 facilitates providing shim adjustability by varying the thickness or width of the ring 176 of shims 162 and also facilitates compensating for axial harmonics. Additionally, transverse harmonics may be compensated for by utilizing different quantities of shims 162 at different axial locations.

Figure 6:
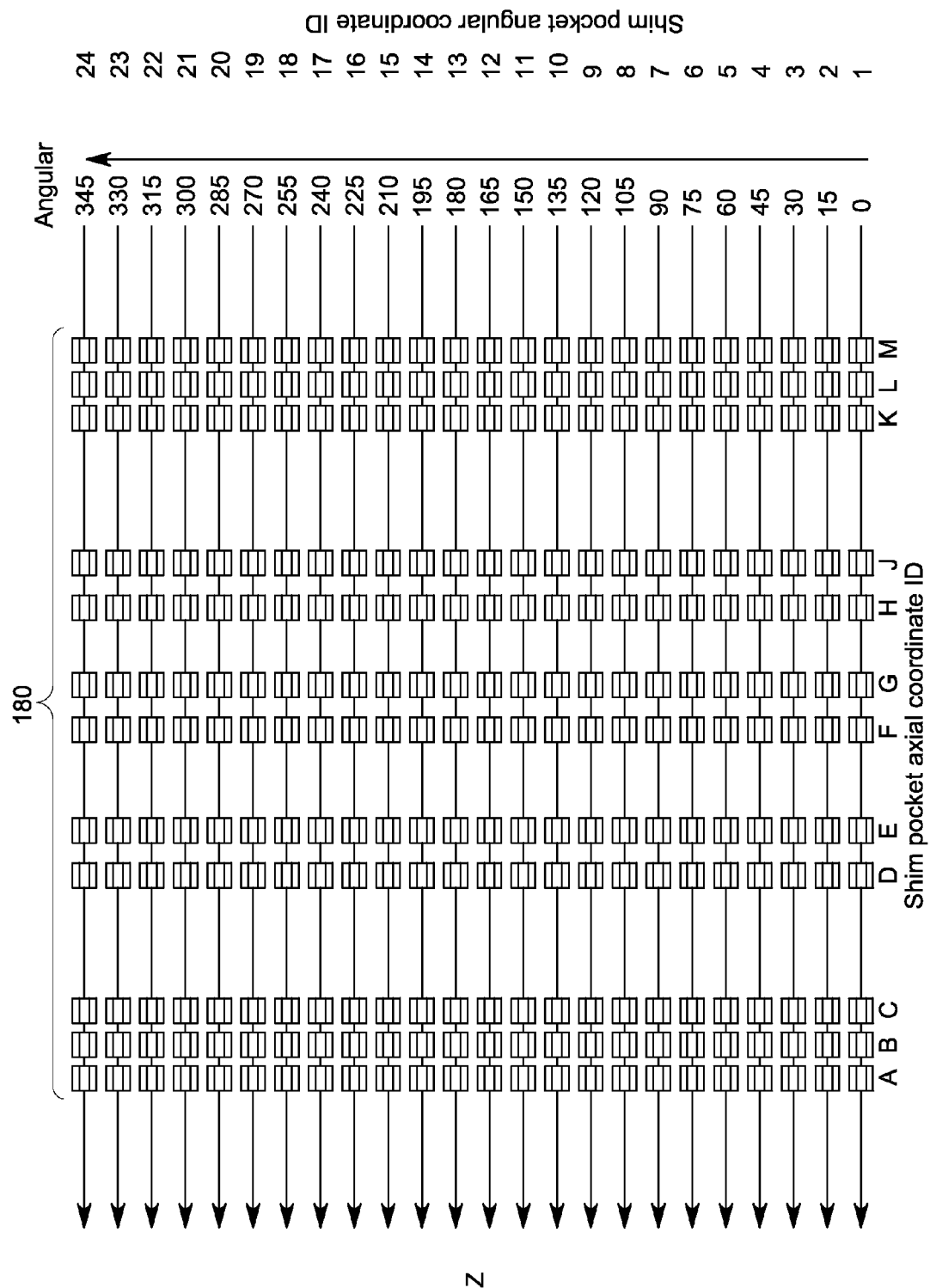
FIG. 6 is a plan view illustrating various passive shim locations in accordance with various embodiments.

For example, FIG. 6 illustrates a plan view of the locations of exemplary locations 180 on the superconducting magnet 12 that may be selected to receive the magnet shims 162 described above. The physical locations on the superconducting magnet 12 may also be referred to herein as shim pockets 180. As shown in FIG. 6, superconducting magnetic 12 is generally cylindrical, thus the columns A . . . M are arranged along the Z-axis, e.g. the imaging axis, and the rows are arranged circumferentially around the coil former 52 in a radial direction denoted in degrees. In this embodiment, there are twelve shim locations denoted along the Z-axis, A . . . M. Moreover, for each location along the Z-axis, there are 24 radial locations denoted as 0 . . . 24. Thus, for each axial location, there are 24 separate radial locations, or shim pockets 180, that may be utilized to install a shim 162. Accordingly, in this embodiment, each shim 162 has a length that extends approximately 15 degrees radially around the circumference of the superconducting magnet 12. However, shims 162 having other lengths may be utilized as discussed above. It should be realized that the quantity of axial and radial locations, or shim pockets 180, shown in FIG. 6 is exemplary and is used to explain the positioning of various magnet shims 162 to correct for axial and transverse harmonics. However, in other embodiments, there may be different quantities of axial and radial locations selected. It should also be realized that similar shim locations may also be placed on the shim holder 166.

Figure 7:
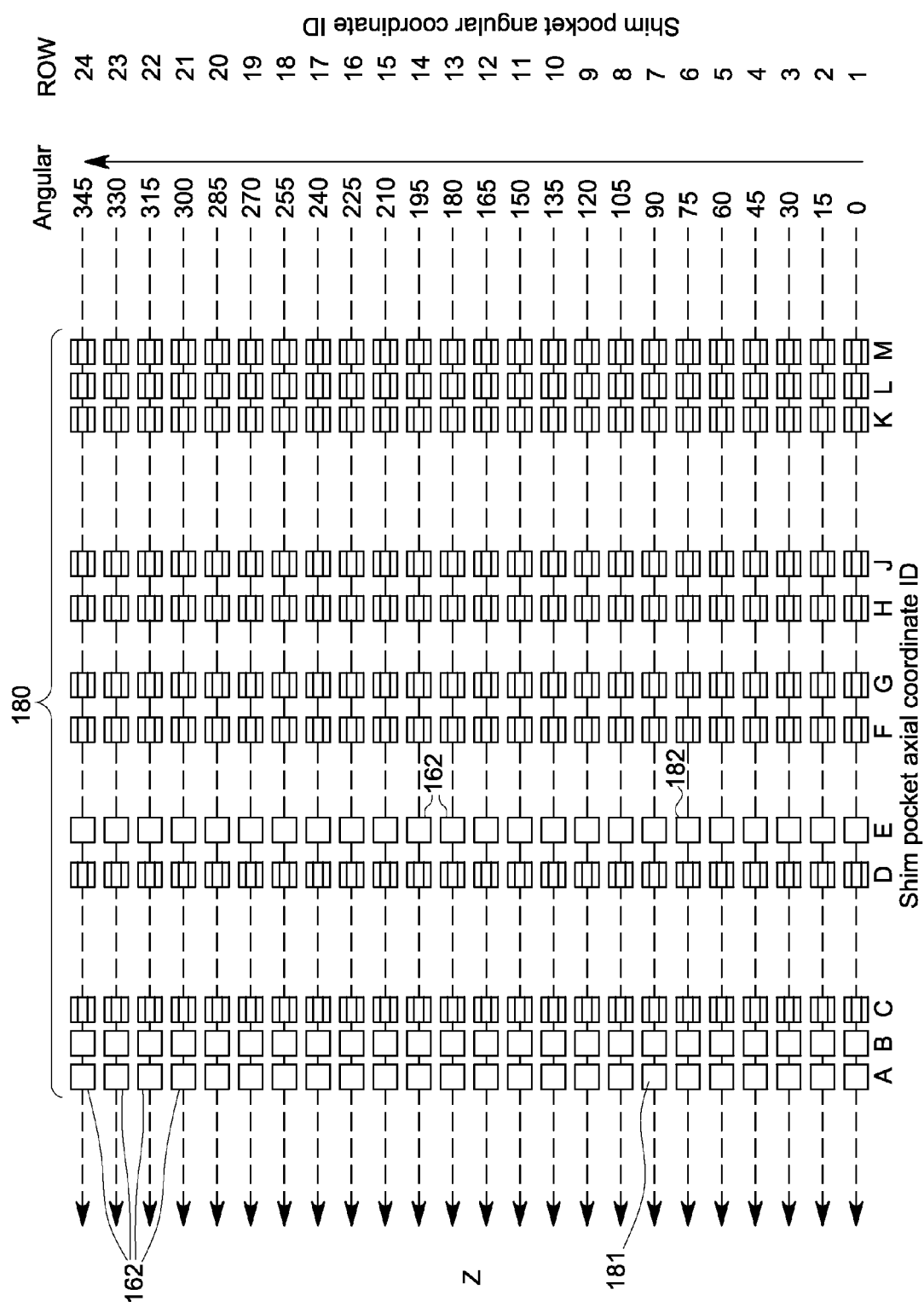
FIGS. 7-14 are plan views illustrating various passive shims that may be installed in accordance with various embodiments.
Figure 8:
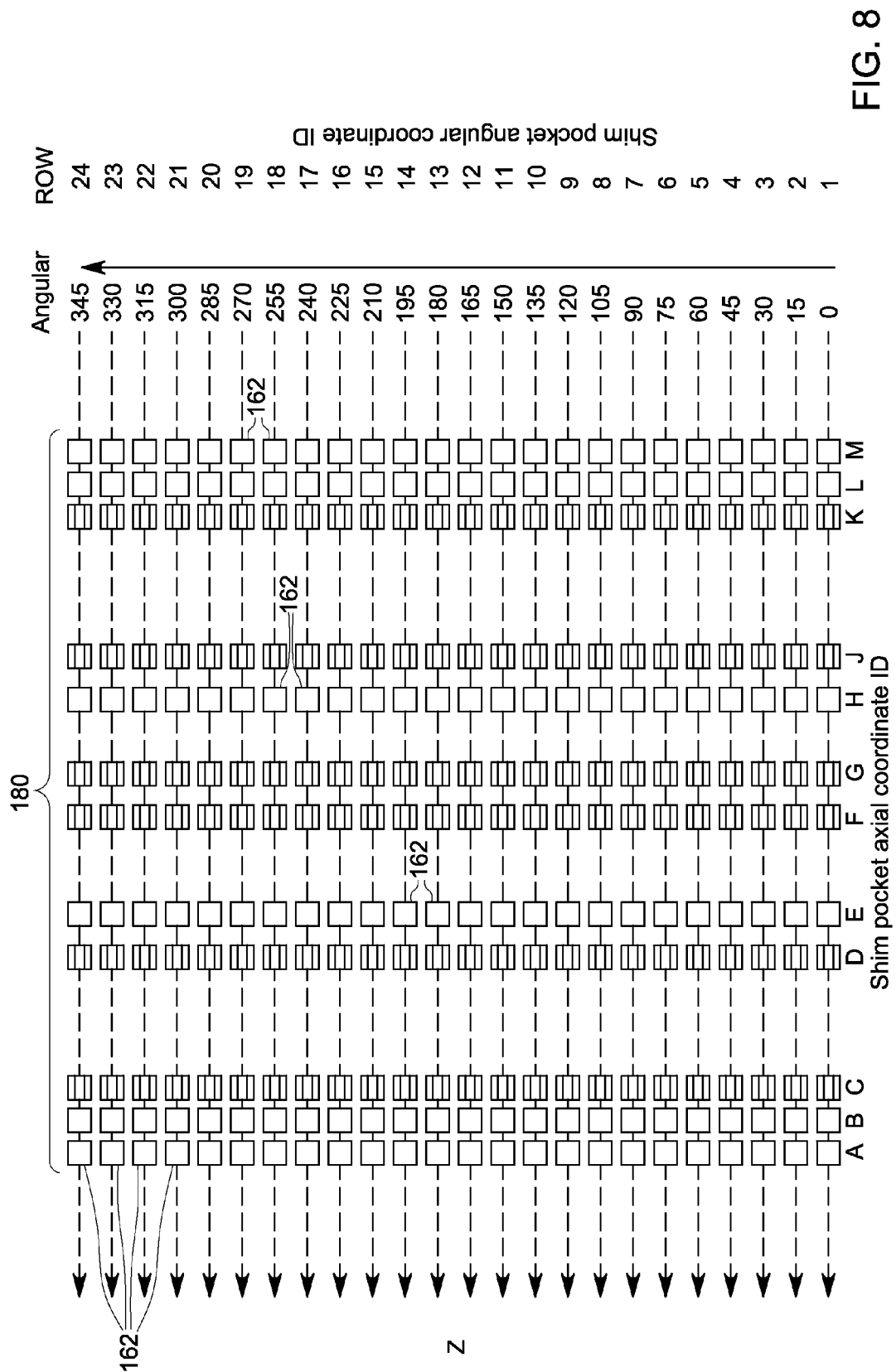
Figure 9:
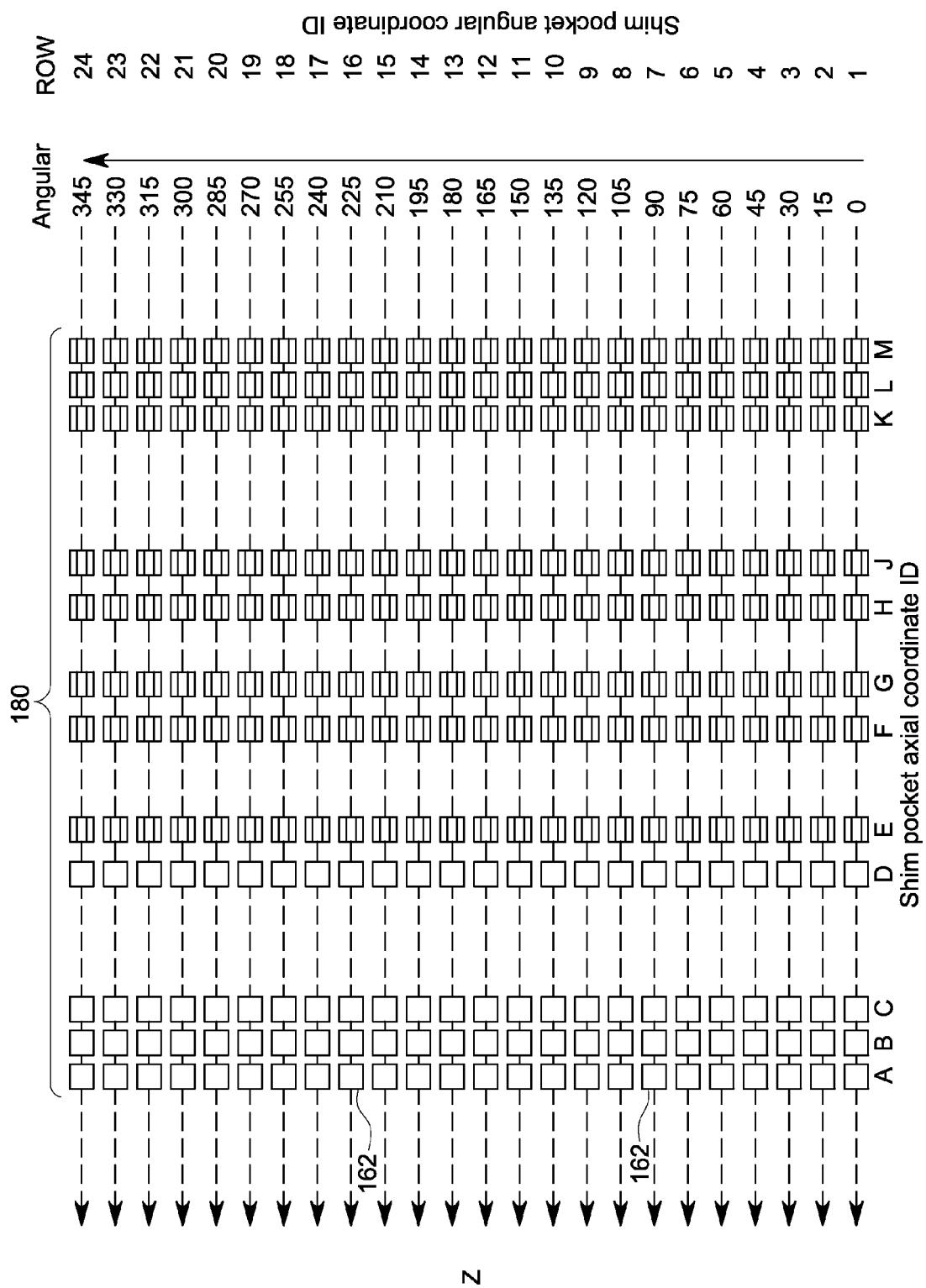
Figure 10:
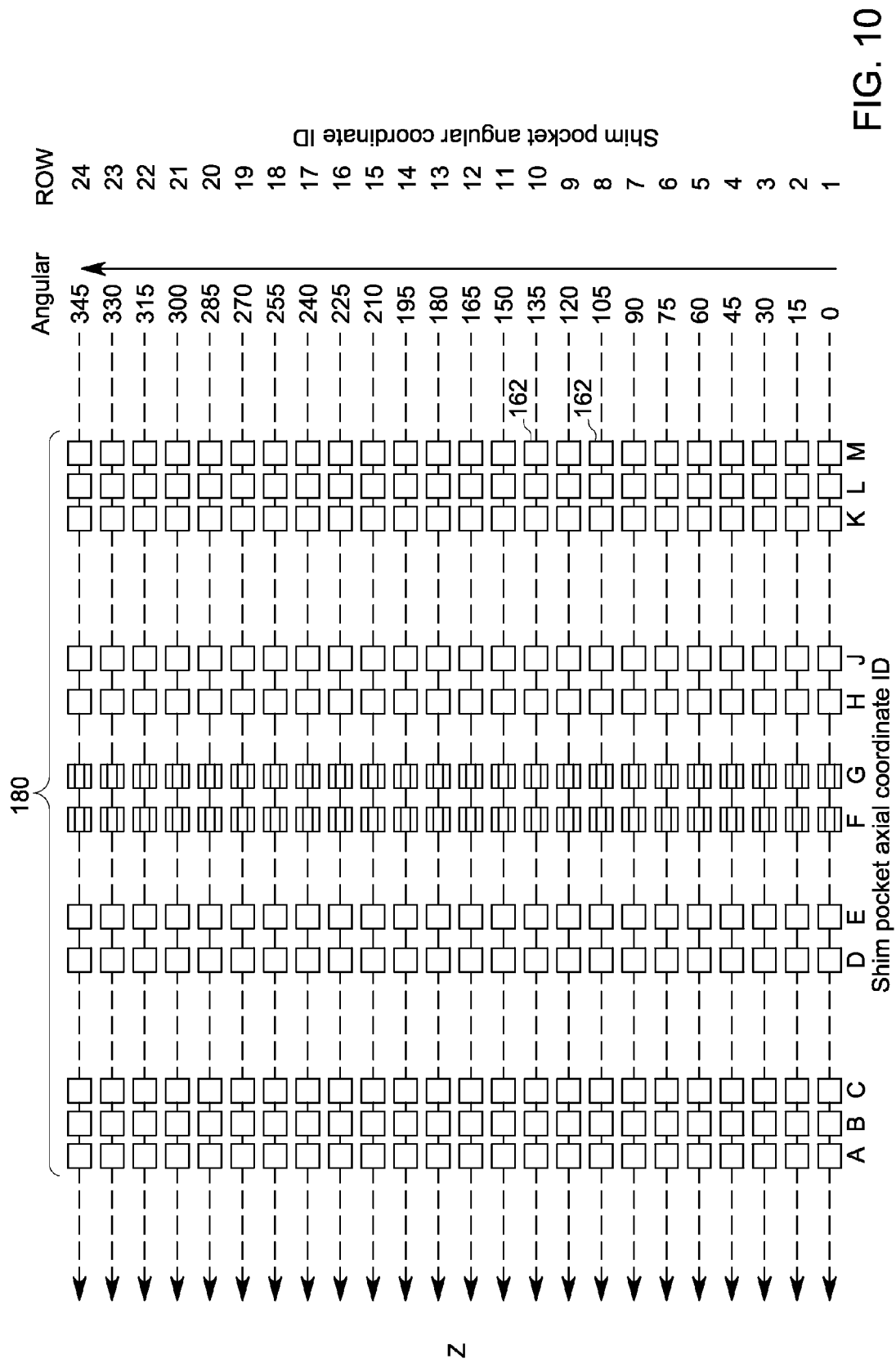
Figure 11:
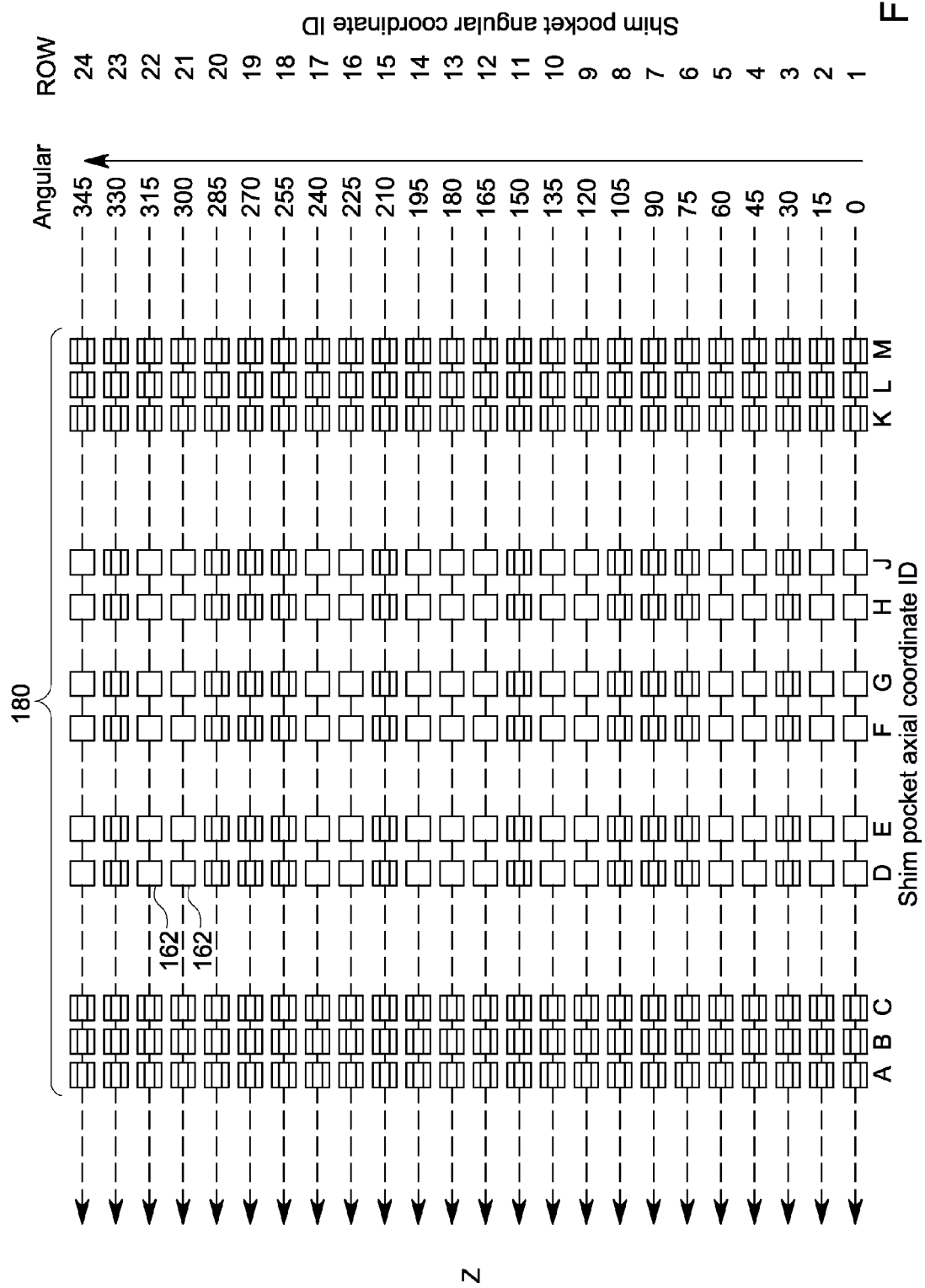
Figure 12:
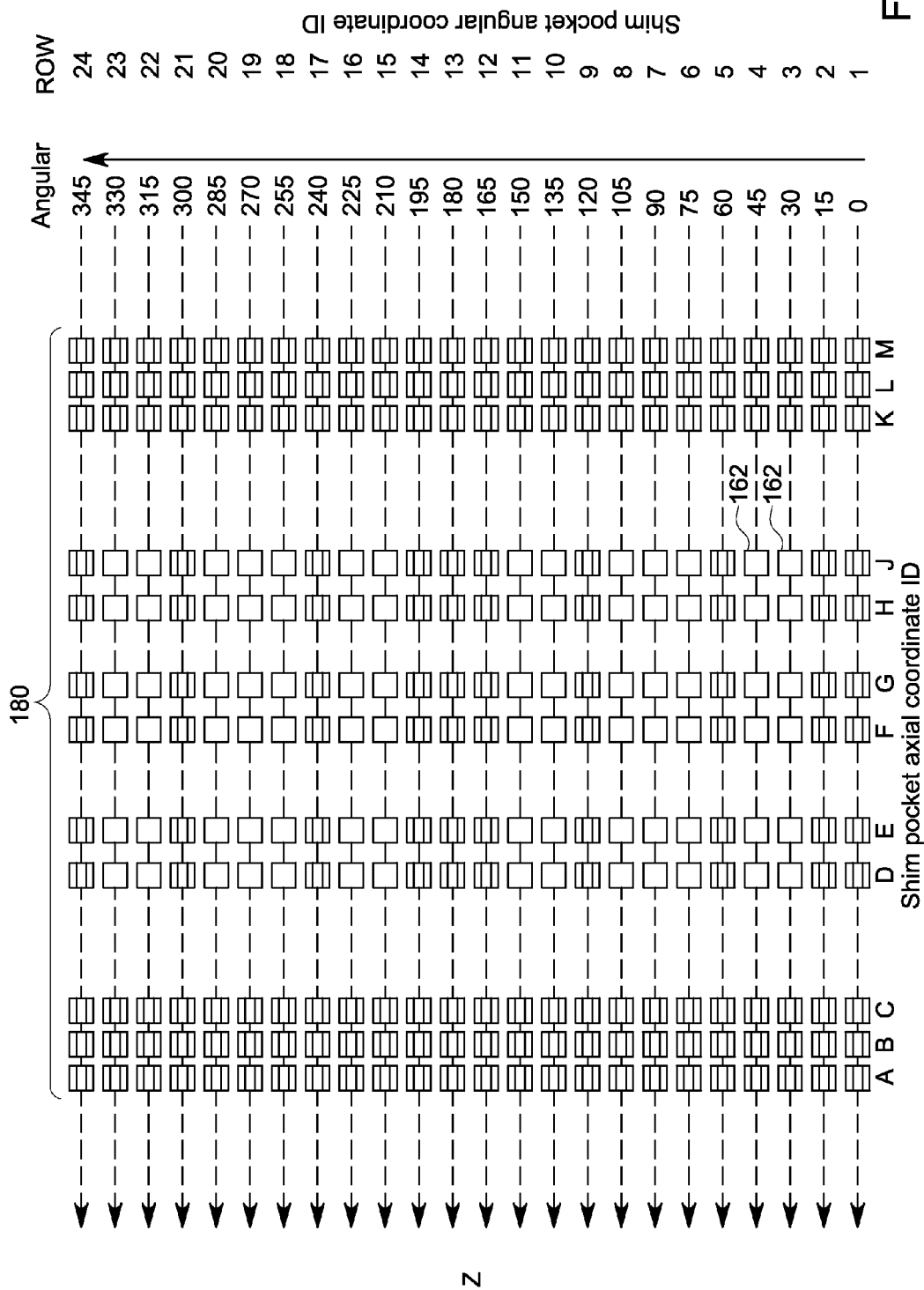
Figure 13:
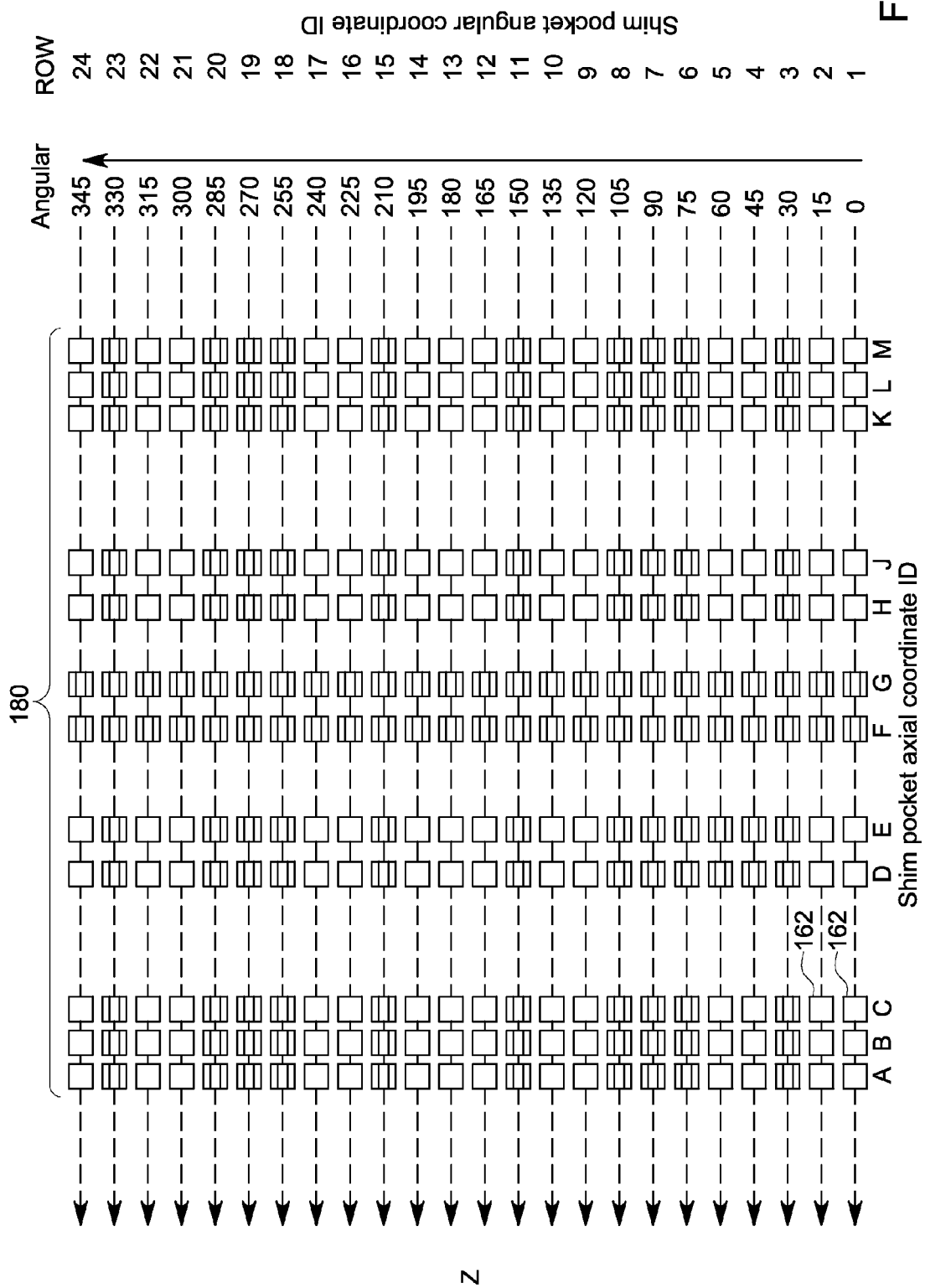
Figure 14:
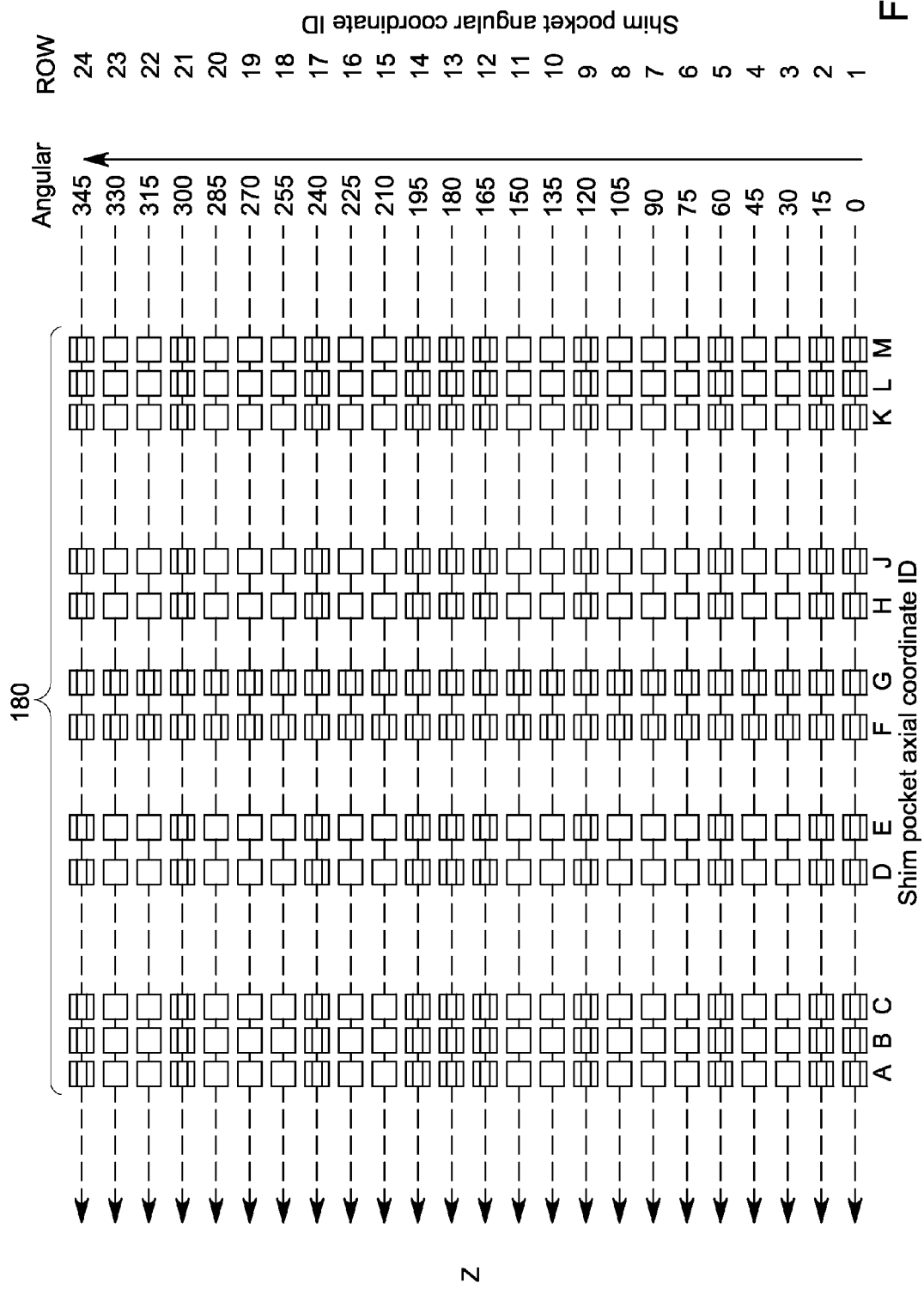

FIGS. 7-14 illustrate plan views of the exemplary shim pockets 180 that may be formed on the coil former 52 and configured to receive one or more shims 162 as discussed above. Moreover, FIGS. 7-14 illustrate various exemplary shimming arrangements that may be utilized to compensate for both axial and transverse field harmonics. For example, FIG. 7 illustrates a plurality of shims 162 installed at a radial positions in rows 1-24, an axial positions in columns A, B, and E. The exact position of the each shim, for example, a shim 181 may be denoted as 10A1, wherein 10 is the row number, A is the column number and 1 denotes the thickness of the shim 181. FIG. 7 also illustrates a second shim 182 that is installed at a radial position in row 6, an axial position in column E and having a thickness of 2 millimeters. Thus shim 182 may be denoted as 6E2. Thus, FIGS. 7, 8, 9, and 10 illustrate exemplary shims 162 that may be installed to compensate for inhomogeneties or axial harmonics identified in the Z1, Z2, Z3, and Z4 directions, respectively. FIGS. 11-14 illustrate exemplary shims 162 installed to compensate for inhomogeneties or transverse harmonics identified in the X, Y, ZX, and ZY directions, respectively.

Referring again to FIG. 3, at 110 the passive shimming process is completed after the shims 162 are installed as shown in FIGS. 7-14 to compensate for inhomogeneties. In one embodiment, the superconducting magnet 12 may optionally be re-mapped to identify any remaining inhomogeneities that were not corrected after the magnet shims 162 were installed at 108. Any newly identified inhomogeneities are corrected as discussed above in steps 102-108. Optionally, the method 100 may proceed to step 112. The method 100 may be repeated until the inhomogeneity of the measured magnetic field in the imaging volume is reduced to within a predetermined specification.

At 112, the superconducting magnet is placed in an operational configuration. For example, as discussed above, the superconducting magnet 12 is mapped at room temperature, e.g. cold-iron shimming. Based on the cold-iron shimming, the shims 162 are installed on the superconducting magnet 12. Thus, at 112, the temperature of the superconducting magnet 12 is reduced by installing the superconducting magnet 12 into the vessel 14, filling the vessel 14 with liquid helium, and then sealing the superconducting magnet 12 within the helium vessel 14. After the superconducting magnet 12 is installed, and sealed, within in the vessel 14, the imaging system 10 may be operated at typical operating temperatures, i.e. a normal operational state, required to perform an imaging procedure. Because, the magnet shims 162 are submerged in liquid helium, the temperature of the magnet shims 162 does not substantially change during the imaging process. Thus, the magnet shims 162 are utilized to cancel out a significant portion of the inhomogeneous field components that are identified during the mapping at 102 and prior to the superconducting magnet 12 being installed in the vessel 14.

At 114, the superconducting magnet 12 is again mapped using the computer shim code discussed above to identify any residual inhomogeneities that were not corrected using the shims 162 discussed above.

At 116, a second set of passive shims, e.g. the tray shims 64, identified during the mapping procedure at 114 are installed on the shim tray 62. Thus, the magnet shims 162 are installed on the superconducting magnet 12 during the fabrication process to reduce or eliminate the inhomogeneities identified during fabrication. After the superconducting magnet 12 is installed in the imaging system 10, the superconducting magnet 12 is again mapped to identify any remaining residual inhomogeneities. The residual homogeneities may then be corrected or reduced by installing the tray shims 64 in the shim tray 62.

Thus, a superconducting magnet is provided that includes a plurality of passive magnet shims that are mounted directly to the superconducting magnet in operation, the magnet passive shims facilitate correcting inhomogeneties identified during the construction of the superconducting magnet. A second different set of passive shims, e.g. the tray shims, may then be utilized to correct for any remaining inhomogeneties identified after the superconducting magnet is installed in the cooling vessel.

Accordingly, in some embodiments, the magnet shims installed on the superconducting magnet may be formed into rings, wherein each ring may include a plurality of individual magnet shim segments. The magnet shim segments in each ring may be separated by a gap to provide eddy current interruption. The rings/segments may be positioned at predetermined locations, using mechanical mounting devices that enable the magnet shims to be mounted to the superconducting magnet. Magnet shim adjustability is provided by varying thickness or width of the rings preferably by stacking a plurality of passive shims at the same location on the superconducting magnet. Axial harmonics are compensated using constant stack-up of shim segments that are arranged at various locations radially around the superconducting magnet from 0-360 degrees. Transverse harmonics are compensated by varying the quantity of shim segments stacked at each axial location.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A method of shimming a superconducting magnet assembly that includes a cryostat and a superconducting magnet configured to be installed in the cryostat, said method comprising:
   while at room temperature injecting a current into coils of the superconducting magnet in order to generate a mapping field of the superconducting magnet;
   measuring the mapping field;
   determining, based on the mapping field, a plurality of room temperature field inhomogeneity characteristics of the superconducting magnet while the superconducting magnet is at room temperature and prior to the superconducting magnet being sealed in the cryostat;
   using the plurality of room-temperature field inhomogeneity characteristics in order to extrapolate with a processor what a plurality of normal-operating-state field inhomogeneity characteristics would be when the superconducting magnet is operating at normal operating temperature; and
   installing an initial set of passive shims inside the cryostat while the superconducting magnet is at room temperature, the initial set of passive shims being configured to compensate for the plurality of field inhomogeneity characteristics at a normal operating state when the superconducting magnet is operating at a normal operational temperature.

2. A method in accordance with claim 1 further comprising: utilizing the normal-operating-state field inhomogeneity characteristics to determine magnetic field compensation;
   utilizing the magnetic field compensation in order to determine at least one of a shim material, a shim size, or a shim location of the initial set of passive shims.

3. A method in accordance with claim 1 further comprising: measuring the geometric properties of the superconducting magnet and utilizing the geometric properties in order to indirectly determine the probe-temperature field inhomogeneity characteristics.

4. A method in accordance with claim 1, wherein the mapping includes determining at least one of a field strength, a field distribution, or harmonics of the mapping field and utilizing the at least one of a field strength, a field distribution, or harmonics of the mapping field, in order to determine the room temperature field inhomogeneity characteristics.

5. A method in accordance with claim 1, wherein the superconducting magnet comprises a coil former and a plurality of magnetic coils supported on the coil former, the method further comprising installing the initial set of passive shims on the coil former.

6. A method in accordance with claim 1, wherein the superconducting magnet comprises a coil former, a plurality of magnetic coils supported on the coil former, and a shim holder that is mounted to the coil former, the method further comprising installing the initial set of passive shims on the shim holder.

7. A method in accordance with claim 6, wherein the shim holder is a loadbearing structural element of the superconducting magnet.

8. A method in accordance with claim 1, wherein the installing further comprises coupling at least one ring-shaped passive shim to the superconducting magnet based on the determined room-temperature homogeneity characteristics.

9. A method in accordance with claim 1, wherein the installing further comprises coupling a plurality of passive shims segments to the superconducting magnet based on the determined room-temperature homogeneity characteristics, the shims segment being arranged about a common axis.

10. A method in accordance with claim 1, wherein the installing further comprises coupling a plurality of passive shims segments to the superconducting magnet based on the determined room-temperature homogeneity characteristics, the shim segments being separated by a gap in order to provide any current interruption.

11. A method in accordance with claim 1, wherein determining the plurality of room-temperature homogeneity characteristics comprises:
    measuring a magnetic field in a central bore of the superconducting magnet at predetermined points;
    determining a magnetic field inhomogeneity from the measured magnetic field; and
    installing the initial set of passive shim on the superconducting magnet based on the determined magnetic field inhomogeneity.

12. A superconducting magnet assembly comprising:
    a superconducting magnet; and
    a controller that controls a current to be injected into coils of the superconducting magnet, while at room temperature, in order to generate a mapping field of the superconducting magnet;
    a receiver in order to measure the mapping field;
    the controller configured to determine, based on the mapping field, a plurality of from-temperature field inhomogeneity characteristics of the superconducting magnet while be superconducting magnet is at room temperature and prior to the superconducting magnet being sealed in the cryostat;
    the controller being configured to use the plurality of room-temperature field inhomogeneity characteristics in order to extrapolate with a processor what a plurality of normal-operating-state field inhomogeneity characteristics would be when the superconducting magnet is operating at normal operating temperature; and
    an initial set of passive shims installed on the superconducting magnet within the cryostat, while the superconducting magnet is at room temperature, the initial set of passive shims being configured to compensate for the plurality of field inhomogeneity characteristics at a normal operating state when the superconducting magnet is operating at a normal operational temperature.

13. A superconducting magnet assembly in accordance with claim 12, wherein the superconducting magnet assembly includes a coil former and a plurality of magnetic coils supported by the coil former, the initial set of passive shims being mounted to the coil former.

14. A superconducting magnet assembly in accordance with claim 12, wherein the superconducting magnet includes a coil former and a plurality of magnetic coils supported by the coil former, the initial set of passive shims being mounted to a shim holder that is mounted to the coil former.

15. A superconducting magnet assembly in accordance with claim 14, wherein the shim holder is a loadbearing structural element of the superconducting magnet.

16. A superconducting magnet assembly in accordance with claim 12, further comprising a cryostat, the superconducting magnet being installed in the cryostat.

17. A superconducting magnet assembly in accordance with claim 12, further comprising a shim tray and a different second set of passive shims being installed in the shim tray.

18. A superconducting magnet assembly in accordance with claim 12, wherein the initial set of passive shims comprises a plurality of shim segments being separated by a gap order to provide eddy current interruption.

19. A Magnetic Resonance Imaging (MRI) system comprising:
    a superconducting magnet assembly including a superconducting magnet including a coil former and a plurality of magnetic coils formed on the coil former,
    a controller that controls a current to be injected into the coils, while at room temperature, in order to generate a mapping field of the superconducting magnet;
    a receiver in order to measure the mapping field;
    the controller being configured to determine, based on the mapping field, a plurality of room-temperature field inhomogeneity characteristics of the superconducting magnet while the superconducting magnet is at room temperature and prior to the superconducting magnet being sealed in the cryostat;
    the controller also being configured to use the plurality of from-temperature field inhomogeneity characteristics in order to extrapolate with a processor what a plurality of normal-operating-state field inhomogeneity characteristics would be when the superconducting magnet is operating at normal operating temperature; and
    an initial set of passive shims installed on the superconducting magnet, within its cryostat, while the superconducting magnet is at room temperature, the initial set of passive shims being configured to compensate for the plurality of field inhomogeneity characteristics at a normal operating state when the superconducting magnet is operating at a normal operational temperature.

20. An MRI system in accordance with claim 19, wherein the initial set of passive shims are mounted to the coil former, the initial set of passive shims being separated by a gap in order to provide eddy current interruption.

21. An MRI system in accordance with claim 19, wherein the initial set of passive shims are mounted to a shim holder that is mounted to the coil former, the initial set of passive shims being separated by a gap in order to provide eddy current interruption.

22. An MRI system in accordance with claim 19, further comprising a cryostat, the superconducting magnet being installed in the cryostat.

23. An MRI system in accordance with claim 19, further comprising a shim tray and a different second set of passive shims being installed in the shim tray.

* * * * *